United States Patent [19]

Rusznyak

[11] Patent Number: 4,649,292
[45] Date of Patent: Mar. 10, 1987

[54] CMOS POWER-ON DETECTING CIRCUIT

[75] Inventor: Andreas Rusznyak, Chene-Bougeries, Switzerland

[73] Assignee: Motorola, Inc., Schaumburg, Ill.

[21] Appl. No.: 709,236

[22] Filed: Mar. 6, 1985

[30] Foreign Application Priority Data

Mar. 14, 1984 [GB] United Kingdom ............... 8406687

[51] Int. Cl.[4] .......................................... H03K 17/30
[52] U.S. Cl. ................................... 307/362; 307/246; 307/304; 307/296 R; 307/594
[58] Field of Search ............ 307/200 B, 450, 362–363, 307/494, 496, 497, 579, 585, 592, 594, 605, 296 R, 297, 246, 304; 357/42

[56] References Cited

U.S. PATENT DOCUMENTS

| | | | |
|---|---|---|---|
| 4,045,688 | 8/1977 | Stewart | 307/585 |
| 4,103,187 | 7/1978 | Imamura | 307/200 B X |
| 4,173,756 | 11/1979 | Kawagai et al. | 307/594 X |
| 4,309,627 | 1/1982 | Tabata | 307/362 |
| 4,414,503 | 11/1983 | Hashimoto | 357/42 X |
| 4,507,572 | 3/1985 | Hashimoto et al. | 307/296 R |
| 4,521,696 | 6/1985 | Raghunathan | 307/362 X |

Primary Examiner—Stanley D. Miller
Assistant Examiner—D. R. Hudspeth
Attorney, Agent, or Firm—Vincent B. Ingrassia

[57] ABSTRACT

A CMOS power on detection circuit is described which includes pairs of complementary MOS transistors being connected in series between two supply lines. Each pair of transistors includes a long and a short channel transistor. Biasing the transistors by the rising supply voltage and by the voltages on the nodes formed by the pairs respectively allows to reduce or to cut current consumption once the detection is performed.

8 Claims, 6 Drawing Figures

CMOS POWER-ON DETECTING CIRCUIT

FIELD OF INVENTION

This invention relates to a CMOS power-on detection circuit for indicating when a supply potential reaches a predetermined value.

BACKGROUND ART

Integrated circuit technology permits the fabrication, on a single chip, of complex electronic circuits containing many components.

One frequently used technology for fabricating integrated circuits employs complementary metal-oxide-semiconductor (CMOS) transistors. This technology offers the advantage of enabling the fabrication of components having small dimensions and consequently enables the production of integrated circuits of small surface area with reduced fabrication costs.

A further advantage of CMOS technology is that circuits consuming very low current can be made. For example, logic circuits can be designed so that a DC current path is never established between power supply lines. In such cases the only significant power consumption is caused by supplying charge to capacitances associated with various nodes of the circuit. In the stand-by mode the circuits only consume the current required to balance charge leakages and currents through transistors which are not completely switched off.

In order that the above mentioned advantageous characteristics of CMOS circuits can be exploited over as wide a range of applications as possible, they are often designed to function with a supply voltage whose value only slightly exceeds the absolute value of the higher threshold voltage of the two types (p-channel and n-channel) of transistors employed in the circuit.

Complex systems, such as microprocessors, being the subject of increasing need for production may contain one or more logic circuits (e.g. flip-flops, shift registers, etc.) whose initial state must be defined when the circuit is switched-on so that correct circuit operation ensues.

In order to maintain the possibility of using a low supply voltage it is necessary to provide the above resetting functions as soon as the circuit becomes operational, in other words as soon as the supply voltage has reached its minimum value necessary for the circuit to operate. As explained above this minimum value is just in excess of the higher threshold voltage of the transistors.

Power-on detection circuits are known but suffer the disadvantage that they only indicate when the sum of the two threshold voltages is reached. This known type of circuit also suffers an additional disadvange of consuming current continuously.

This invention seeks to provide a power-on detection circuit in which at least one of the above mentioned disadvantages of known circuits is mitigated.

BRIEF DESCRIPTION OF INVENTION

According to a first aspect of the invention there is provided a CMOS power-on detection circuit for providing an indication when the magnitude of an applied supply voltage exceeds the largest of the threshold voltages of its transistors, the circuit including first and second pairs of complementary MOS transistors each pair being coupled in series between first and second power supply lines, transistors of a first conductivity type having their source electrodes coupled to the first power supply line and transistors of a second conductivity type having their source electrodes coupled to the second power supply line, each pair of transistors including a relatively long and a relatively short channel transistor, the long channel transistor in the first pair being of different conductivity type to that of the long channel transistor of the second pair and the width-to-length ratio of each long channel transistor being large enough to ensure that for gate-source voltages greater than a predetermined value above its threshold voltage, its current is higher than the current in the short channel transistor of its pair for the same gate-source voltage, the short channel transistors of the first and second pairs and the long channel transistor of the firt pair being biased to turn on with increasing value of the applied supply voltage; means coupling a first node formed between the transistors of the first pair to the gate electrode of the long channel transistor of the second pair, the said indication being provided by a predetermined potential change at a second node formed between the transistors of the second pair.

The gate electrode of the long channel transistor of the first pair may be coupled to that power supply line which is coupled to the source electrode of the short channel transistor of its pair.

In one embodiment of the invention the gate electrode of the short channel transistor of the first pair may be coupled to that power supply line which is coupled to the source electrode of the long channel tranistor of its pair.

In another embodiment of the invention the gate electrode of the short channel transistor of the first pair may be coupled to the second node whereby the current through the transistors of the first pair is cut off by the predetermined potential change at the second node.

The gate electrode of the short channel transistor of the second pair may be coupled to that power supply line which is coupled to the long channel transistor of its pair.

First and second circuits, each in accordance with the first aspect of the invention may be coupled together, the conductivity types of the long channel transistors in the first and second pairs of the second circuit being complementary to those in the respective pairs of the first circuit and the circuits being coupled together so that current through predetermined pairs of transistors is cut off when said indication is provided.

According to a second aspect of the invention there is provided a CMOS power on detection circuit for providing an indication when the magnitude of an applied supply voltage exceeds the largest of the threshold voltages of its transistors, the circuit including first, second, third and fourth pairs of complementary MOS transistors, each pair being coupled in series between first and second power supply lines, the sources of the p-channel transistors being coupled to the first power supply line and the sources of the n-channel transistors being coupled to the second power supply line, each pair of transistors including a relatively long channel and a relatively short channel transistor, the width-to-length ratio of each long channel transistor being large enough to ensure that for gate-source voltages greater than a predetermined value above its threshold voltage, its current is higher than the current in the short channel transistor of its pair for the same gate-source voltage, the p-channel transistors in the first and third pairs having long channels and the n-channel transistors in the second and fourth pairs having long channels, the gate electrode of the p-channel transistor of the first pair and the n-channel transistor of the fourth pair being coupled to the second and first power supply lines respectively; a first node formed between the transistors of the first pair being coupled to the gate electrode of the n-channel transistor of the second pair, a second node formed between the transistors of the second pair being coupled to the gate electrodes of the n-channel transistors of the first and third pairs, a third node formed between the transistors of the third pair being coupled to the gate electrodes of the p-channel transistors of the second and fourth pairs and a fourth node formed between the transistors of the fourth pair being coupled to the gate electrode of the p-channel transistor of the third pair, said indication being provided by predetermined potential changes at the second and third nodes.

BRIEF DESCRIPTION OF DRAWINGS

An exemplary embodiment of the invention will now be described with reference to the drawings in which.

DETAILED DESCRIPTION OF INVENTION

Figure 1:
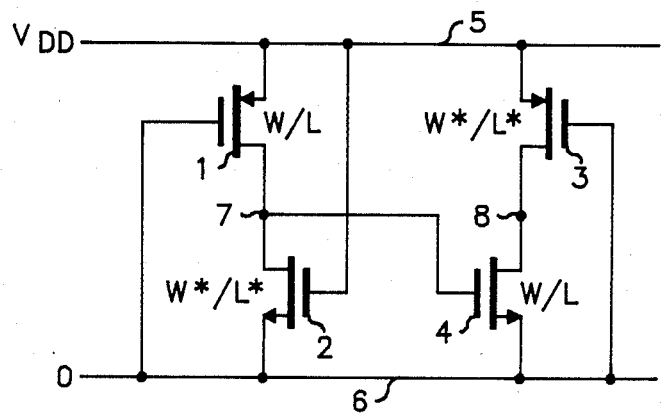
FIG. 1 illustrates a power-on detection circuit in accordance with the present invention.

Referring now to FIG. 1 the power-on detection circuit of the invention comprises a first pair of complementary MOS trasistors formed by a p-channel transistor 1 and an n-channel transistor 2 and a second pair of complementary MOS transistors formed by a p-channel transistor 3 and an n-channel transistor 4.

The transistors of each pair are connected in series with one another between first and second power supply lines 5 and 6 respectively. The p-channel transistors 1 and 3 have their source electrodes connected to the supply line 5 whilst the source electrodes of the n-channel transistors 2 and 4 are connected to the supply line 6.

The gate electrodes of the p-channel transistors 1 and 3 are connected to the supply line 6 and the gate electrode of the n-channel transistor 2 is connected to the supply line 5. The gate electrode of the n-channel transistor 4 is connected to a node 7 formed between the transistors 1 and 2.

The channel length $L^*$ of the n-channel transistor 2 is smaller than the channel length $L$ of the p-channel transistor 1. The width to length ratio $W/L$ of the p-channel transistor 1 greater than the ratio $W^*/L^*$ of the n-channel transistor 2.

For the second pair of transistors the p-channel transistor 3 has the shorter length $L^*$ whilst the width to length ratio $W/L$ of the n-channel transistor 4 is greater than the ratio $W^*/L^*$ for the p-channel transistor 3.

The drain current $I_{DS}$ for an MOS transistor is given in good approximation by $$I_{DS} = K(V_{GS} - V_T)^2$$

where K is a factor proportional to the width-to-length ratio of the channel of the transistor.

It is well known that the threshold voltage $V_T^*$ of a short channel MOS transistor is lower than the threshold voltage $V_T$ of a transistor of the same type of conductivity having a longer channel, both belonging to the same integrated circuit. This is illustrated in FIG. 2 which shows a graph of $\sqrt{I_{DS}}$ plotted as a function of gate-source voltage $V_{GS}$ for three different transistors.

Line A is for a transistor having a channel length $L_1$ and channel width $W_1$, line B is for a transistor having a width-to-length ratio $W_2/L_2 = W_1/L_1$ and whose channel length $L_2$ is small compared to the channel length $L_1$ of the transistor of the line A. The line C is for a transistor having a channel of length $L_3 = L_1$ and width $W_3$ higher than the width $W_1$.

Figure 2:
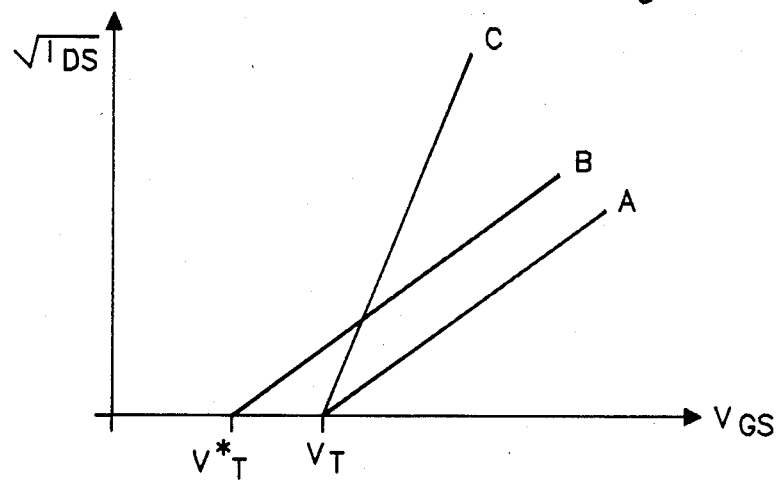
FIGS. 2 to 5 are explanatory graphs.

As FIG. 2 illustrates, for a given gate-source voltage just above the threshold voltage $V_T$ of the transistor of the line A the current of this transistor, with a greater width-to-length ratio, and hence a higher value of K can be lower than the current of the transistor of line B with a lower K factor having a lower threshold voltage $V_T^*$ than $V_T$. However, the current in the high K factor transistor exceeds that in the low K factor transistor for higher gate-source voltages.

The principles illustrated in FIG. 2 will now be applied in discussing the operation of the circuit of FIG. 1 in response to a rising supply voltage $V_{DD}$ applied across the two pairs of transistors. For simplicity the influence of the output resistances of the transistors will be neglected and the same carrier mobility for n and p channel transistors will be assumed.

Figure 3:
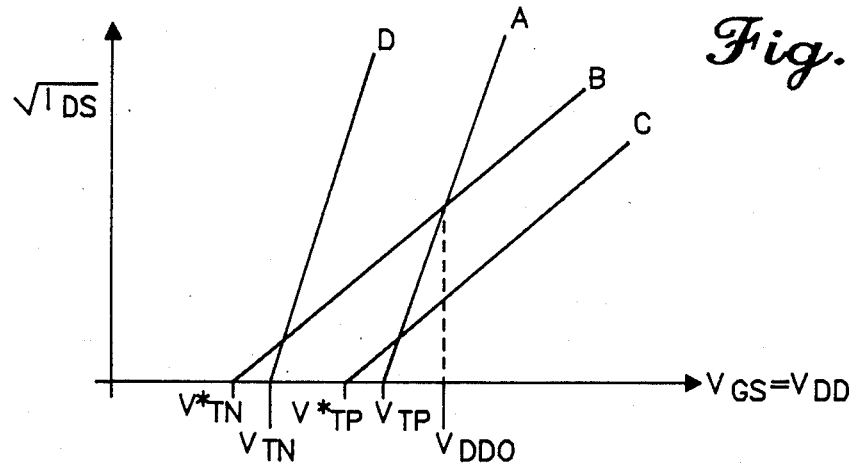

Three cases fall to be considered; $V_{TP} > V_{TN}$, $V_{TP} = V_{TN}$ and $V_{TP} < V_{TN}$ where $V_{TP}$ and $V_{TN}$ signify the absolute value of the threshold voltages of the long channel p and n transistors respectively. The case in which $V_{TP}$ is greater than $V_{TN}$ will firstly be discussed and reference will now also be made to FIG. 3 of the drawings in which $I_{DS}$ is plotted as a function of $V_{DD}$ for each of the transistors 1, 2, 3 and 4. In FIG. 3 the lines A, B, C and D correspond to the transistors 1, 2, 3 and 4 respectively.

For this case as the value of the supply voltage $V_{DD}$ increases the line B illustrates that the short n-channel transistor 2 turns on first and this will cause the potential of the node 7 to be held at the potential of the supply line 6, namely zero potential as long as the supply voltage $V_{DD}$ is less than the value $V_{DDO}$ at which the graphs for the transistors 1 and 2 cross. The short channel transistor 3 is controlled by the rising voltage $V_{DD}$ so that the potential $V_8$ of the node 8 tracks with $V_{DD}$.

When $V_{DD}$ exceeds $V_{DDO}$ for which the relation $$K_A(V_{DDO} - V_{TP})^2 = K_B(V_{DDO} - V_{TN}^*)^2$$

is true, the voltage $V_7$ at the node 7 changes to $V_{DD}$. The change of voltage at the node 7 occurs because the K factor $K_A$ for the transistor 1 is greater than the factor $K_B$ for the transistor 2. On the other hand because the transistor 4 has more current for a given gate-source voltage than the transistor 3 the voltage $V_8$ at the node 8 changes simultaneously to zero.

Figure 4:
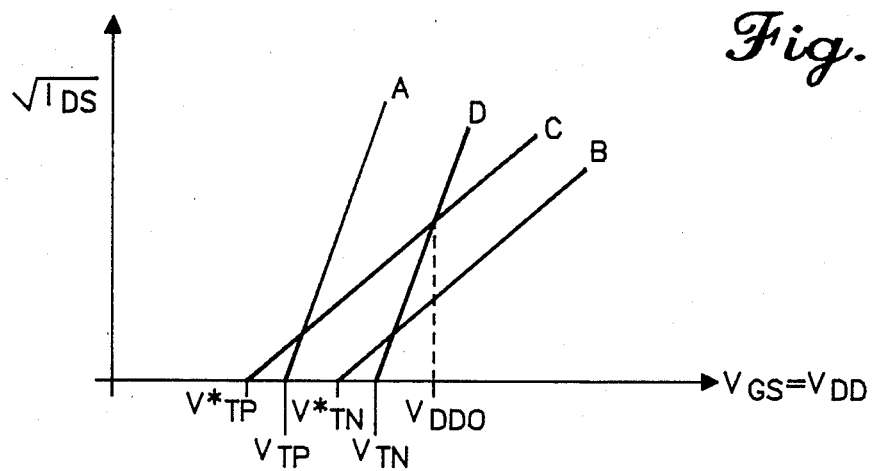

The case for $V_{TP} < V_{TN}$ is illustrated in the graph of FIG. 4. In this case, the p-channel transistors 1 and 3 will turn on first and the voltage $V_7$ at the node 7 will track with the supply voltage $V_{DD}$. The voltage $V_8$ at the node 8 remains equal to $V_{DD}$ as long as $V_{DD}$ is smaller than $V_{DDO}$. When $V_{DD} = V_{DDO}$ $$K_D(V_{DDO} - V_{TN})^2 = K_C(V_{DDO} - V_{TP}^*)^2$$

and the voltage $V_8$ at the node 8 will change to zero since the K factor $K_D$ of the transistor 4 is greater than the factor $K_C$ of the transistor 3.

As shown regardless of whether $V_{TP}$ is greater or less than $V_{TN}$, the voltage $V_8$ at the node 8 changes in each case from the supply voltage $V_{DD}$ to zero when $V_{DD}=V_{DDO}$. In other words the voltage $V_8$ becomes zero when the supply voltage reaches a value slightly higher than the higher of the threshold voltages of the transistors. A similar change in the value $V_8$ would occur for the case of $V_{TP}=V_{TN}$.

The node 8 can therefore be used as an output terminal and the predetermined change in the voltage at that terminal, namely from the value $V_{DD}$ to the value zero indicates that the applied supply voltage has reached the required value.

Figure 5:
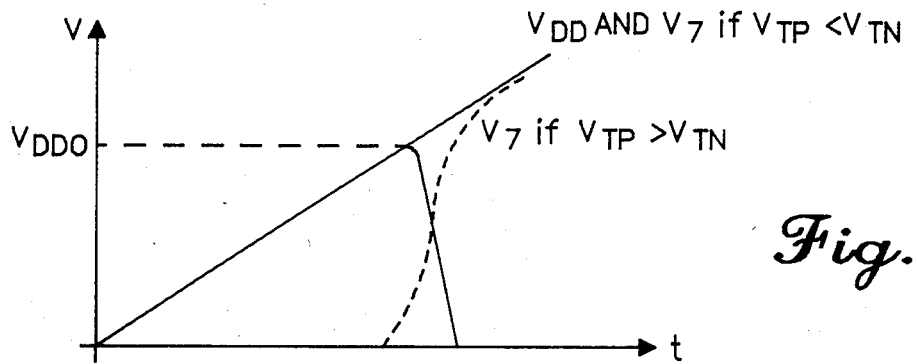

The behaviour of the voltages $V_7$ and $V_8$ of the nodes 7 and 8 respectively are illustrated in FIG. 5 of the drawings which is a graph of voltage versus time.

The actual value of the detected threshold voltage can be shown to be given by $$V_{DDO} \approx \overline{V}_T + \frac{\Delta V_T}{2} \frac{\sqrt{K/K^*}+1}{\sqrt{K/K^*}-1}$$

where $\overline{V}_T$ is the mean value of the absolute values of the threshold voltages for the long p and n channel transistors and $\Delta V_T$ is the difference between them. K and K* are the factors proportional to W/L and W*/L* for the long and short channel transistors respectively.

The circuit of FIG. 1 provides the desired power-on detection and detects the point at which the applied supply voltage exceeds the higher threshold voltage of the transistors of the circuit. The circuit of FIG. 1 therefore provides a significant advantage over the prior art circuits in which supply voltage detection only occurs when the supply voltage exceeds the sum of the threshold voltages. The transistors of FIG. 1 are not however switched off once the detection is performed.

A modification may be made to the circuit of FIG. 1 in which the gate electrode of the transistor 2 is connected to the node 8 rather than to the supply line 5. In such a circuit the transistor 2 would be cut off by the fall in the potential at the node 8 when the higher threshold voltage is detected and this would therefore cut off current through the transistors 1 and 2.

In order to cut off current through the transistors 3 and 4 it is necessary that these transistors be controlled by a voltage complementary to $V_8$. Such a voltage may be produced by a circuit complementary to that shown in FIG. 1, which circuit would itself be controlled by the voltage $V_8$ in order to cut off its own current.

Figure 6:
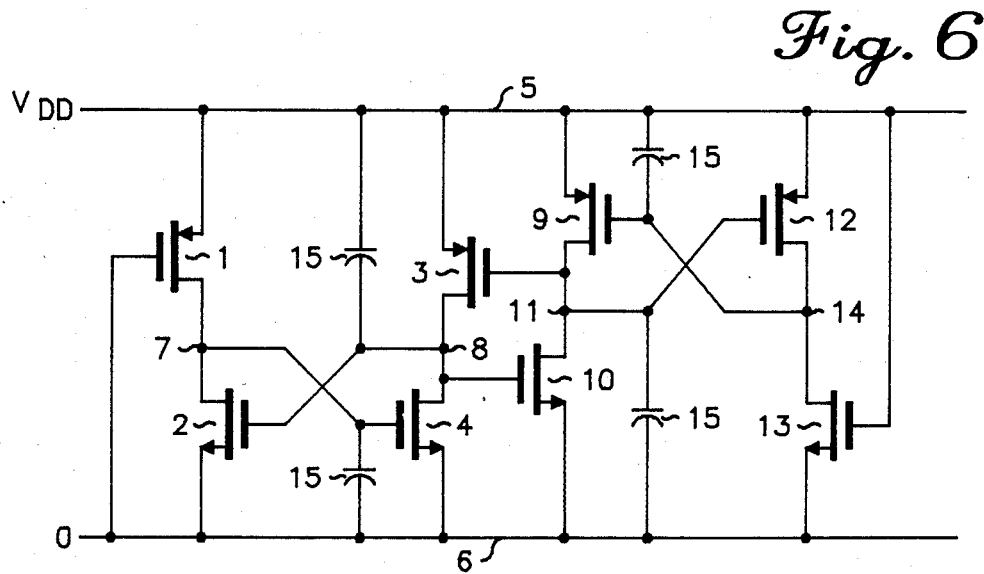
FIG. 6 illustrates a preferred embodiment of a power-on detection circuit of the invention.

A preferred embodiment of the invention in which the above occurs is illustrated in FIG. 6 to which reference will now be made. Like parts in FIG. 6 to those in FIG. 1 bear like reference numerals.

In FIG. 6 third and fourth pairs of complementary MOS transistors are connected between the supply lines 5 and 6 the transistors in each pair being connected in series with one another between the two supply lines.

The third pair of transistors comprises a long channel p-channel transistor 9 and a short channel n-channel transistor 10, the transistors 9 and 10 having their source electrodes connected to the supply lines 5 and 6 respectively and their drain electrodes connected together to form a node 11.

The fourth pair of transistors comprises a short channel p-channel transistor 12 and a long channel n-channel transistor 13 the transistors 12 and 13 having their source electrodes connected to the supply lines 5 and 6 respectively and their drain electrodes connected together form a node 14.

The gate electrode of transistor 13 is connected to the supply line 5 whilst the gate electrodes of the transistors 9 and 12 are coupled to the nodes 14 and 11 respectively.

The gate electrode of the transistor 10 is connected to the node 8 and the gate electrode of the transistor 3 of the second pair of transistors is connected to the node 11 rather than to the supply line 6. Capacitors 15 are connected in parallel with each short channel transistor.

The portion of FIG. 6 comprised by the first and second pairs of complementary MOS transistors operates exactly as described with reference to FIG. 1. The voltage $V_7$ remains at zero as long as $V_{DD}$ remains less than $V_{DDO}$ for the case in which $V_{TP}>V_{TN}$, and is approximately equal to the value of $V_{DD}$ for the case $V_{TP}<V_{TN}$. In both cases and if $V_{TP}$ equals $V_{TN}$, the voltage $V_8$ at the node 8 changes from the value $V_{DD}$ to zero when $V_{DD}$ becomes higher than the higher threshold voltage of the transistors.

The third and fourth pairs of complementary MOS transistors operate in exactly similar manner. If $V_{TP}<V_{TN}$ then the voltage $V_{14}$ at the node 14 tracks with the supply potential $V_{DD}$ until $V_{DD}$ reaches the value $V_{DDO}$. For the case $V_{TP}>V_{TN}$ the value of $V_{14}$ remains at zero. In both cases and for the case $V_{TP}=V_{TN}$ the value $V_{11}$ of the voltage at the node 11 will change from zero to $V_{DD}$ when $V_{DD}$ reaches the value $V_{DDO}$.

When the voltage $V_{DDO}$ is reached by the supply voltage the coupling between the node 8 and the gate electrode of the n-channel transistor 10 will cause this transistor to be turned off thereby cutting off current through the third pair of transistors. The coupling between the node 11 and the gate electrode of the p-channel transistor 3 will cause this transistor to be cut off when the potential at node 11 changes from zero to $V_{DD}$, thereby cutting off current through the second pair of transistors.

The coupling between the node 11 and the gate electrode of the p-channel transistor 12 will also act to turn off transistor 12 and consequently cut off the current through the fourth pair of MOS transistors.

The coupling between the node 8 and the gate electrode of the n-channel transistor 2 will act to turn off transistor 2 and consequently cut off the current through the first pair of MOS transistors. In this way current consumption by the circuit is stopped.

Small capacitors 15 typically some tenths of picofarads may be connected in parallel with each short channel transistor. This prevents the formation of undesired voltages across those transistors. Such voltages could be produced if the parasitic capacitors parallel to the long channel transistors are significant.

The invention has been described by way of example and modifications may be made without departing from the scope of the invention as set forth in the appended claims. In particular appropriate interconnections between pairs of transistors of FIG. 6 may be omitted if it is not required to cut off current flow through all pairs of transistors.

I claim:

1. A CMOS power-on detection circuit for providing an indication when the magnitude of an applied supply voltage exceeds the largest of the threshold voltages of its transistors, the circuit including first and second pairs of- comp-lementary-. MOS transistors each pair being coupled in series between first and second power supply lines, transistors of a first conductivity type having their source electrodes coupled to the first power supply line and transistors of a second conductivity type having their source electrodes coupled to the second power supply line, each pair of transistors including a relatively long and a relatively short channel transistor, the long channel transistor in the first pair being of different conductivity type to that of the long channel transistor of the second pair and the width-to-length ratio of each long channel transistor being large enough to ensure that for gate-source voltages greater than a predetermined value above its threshold voltage, its current is higher than the current in the short channel transistor of its pair for the same gate-source voltage, the short channel transistors of the first and second pairs and the long channel transistor of the first pair being biased to turn on with increasing value of the applied supply voltage, a first node formed between the transistors of the first pair being coupled to the gate electrode of the long channel transistor of the second pair, the said indication being provided by a predetermined potential change at a second node formed between the transistors of the second pair.

2. A circuit as claimed in claim 1 wherein the gate electrode of the long channel transistor of the first pair is coupled to that power supply line which is coupled to the source electrode of the short channel transistor of its pair.

3. A circuit as claimed in claim 1 wherein the gate electrode of the short channel transistor of the first pair is coupled to that power supply line which is coupled to the source electrode of the long channel transistor of its pair.

4. A circuit as claimed in claim 1 wherein the gate electrode of the short channel transistor of the first pair is coupled to the second node formed between the transistors of the second pair.

5. A circuit as claimed in claim 1 wherein the gate electrode of the short channel transistor of the second pair is coupled to that power supply line which is coupled to the long channel transistor of its pair.

6. A CMOS power-on detection circuit comprising first and second circuits coupled together each circuit being as claimed in claim 1, the conductivity types of the long channel transistors in the first and second pairs of the second circuit being complementary to those in the respective pairs of the first circuit and the circuits being coupled together so that current through predetermined pairs of transistors is cut off when said indication is provided.

7. A CMOS power on detection circuit for providing an indication when the magnitude of an applied supply voltage exceeds the largest of the threshold voltages of its transistors, the circuit including first, second, third and fourth pairs of-complementary MOS transistors, each pair being coupled in series between first and second power supply lines, the sources of the p-channel transistors being coupled to the first power supply line and the sources of the n-channel transistors being coupled to the second power supply line, each pair of transistors including a relatively long channel and a relatively short channel transistor, the width-to-length ratio of each long channel transistor being large enough to ensure that for gate-source voltages greater than a predetermined value above its threshold voltage, its current is higher than the current in the short channel transistor of its pair for the same gate-source voltage, the p-channel transistor in the first and third pairs having long channels and the n-channel transistors in the second and fourth pairs having long channels, the gate electrode of the p-channel transistor of the first pair and the n-channel transistor of the fourth pair being coupled to the second and first power supply lines respectively, a first node formed between the transistors of the first pair being coupled to the gate electrode of the n-channel transistor of the second pair, a second node formed between the transistors of the second pair being coupled to the gate electrodes of the n-channel transistors of the first and third pairs; a third node formed between the transistors of the third pair being coupled to the gate electrodes of the p-channel transistors of the second and fourth pairs and a fourth node formed between the transistors of the fourth pair being coupled to the gate electrode of the p-channel transistor of the third pair, said indication being provided by predetermined potential changes at the second and third nodes.

8. A circuit as claimed in claim 7 wherein a capacitor is coupled in parallel with each short channel transistor.

* * * * *